US008884718B2

United States Patent
Sinoussi et al.

(10) Patent No.: US 8,884,718 B2
(45) Date of Patent: Nov. 11, 2014

(54) METHOD AND APPARATUS TO CONTROL THE LC TANK TEMPERATURE NULL CHARACTERISTIC IN A HIGHLY STABLE LC OSCILLATOR

(75) Inventors: Nabil M. Sinoussi, Cairo (EG); Mohamed M. Weheiba, Cairo (EG); Ahmed A. Helmy, Cairo (EG); Ahmed H. A. Razek, Cairo (EG); Ayman Ahmed, Cairo (EG)

(73) Assignee: Si-Ware Systems, Cairo (EG)

( * ) Notice: Subject to any disclaimer, the term of this patent is extended or adjusted under 35 U.S.C. 154(b) by 103 days.

(21) Appl. No.: 13/569,419

(22) Filed: Aug. 8, 2012

(65) Prior Publication Data

US 2013/0314167 A1  Nov. 28, 2013

Related U.S. Application Data

(60) Provisional application No. 61/521,677, filed on Aug. 9, 2011.

(51) Int. Cl.
*H03L 1/00* (2006.01)

(52) U.S. Cl.
USPC ........ 333/176; 331/117 R; 331/167; 331/182; 331/183; 331/186

(58) Field of Classification Search
USPC ........... 331/117 FE, 167, 175, 176, 183, 185, 331/186
See application file for complete search history.

(56) References Cited

U.S. PATENT DOCUMENTS

2009/0115542 A1* 5/2009 Nakamura et al. ............ 331/176

* cited by examiner

*Primary Examiner* — Joseph Chang
*Assistant Examiner* — Jeffrey Shin
(74) *Attorney, Agent, or Firm* — Useful Arts IP (57) ABSTRACT

A substantially temperature-independent LC-based oscillator uses bias control techniques. Temperature independence may be achieved by controlling the harmonic frequency content of the output of the oscillator by controlling the amplitude. Amplitude control may be achieved by inserting a control mechanism in the feedback loop of the oscillator.

27 Claims, 13 Drawing Sheets

METHOD AND APPARATUS TO CONTROL THE LC TANK TEMPERATURE NULL CHARACTERISTIC IN A HIGHLY STABLE LC OSCILLATOR

FIELD OF THE INVENTION

The present invention generally relates to oscillators which provide a highly stable output frequency across a wide range of temperature variation.

BACKGROUND OF THE INVENTION

Electronic clock generation classically relies on a reference oscillator based on an external crystal that is optionally multiplied and/or divided to generate the required clock. The key specifications of a clock, other than its target frequency, are frequency accuracy and stability. Frequency accuracy is the ability to maintain the target frequency across supply and temperature and is usually represented as drift from the target frequency in percent or parts per million (ppm). Long term stability, is impacted by the close-in phase noise of the oscillator. An oscillator using a high-Q element typically has a low phase noise profile, and thus good frequency stability, and is less sensitive to variations in oscillator amplifier gain, which is dependent on supply and temperature.

For example, crystal oscillators (XO) are high-Q oscillators that provide excellent frequency stability and frequency accuracy across supply and temperature stemming from the very high quality factor (Q) of the crystal. However, not all resonators, including crystals, have satisfactory performance across temperature, thus the need for extra circuitry and techniques to decrease and/or compensate for shifts in frequency due to temperature. A temperature compensated crystal oscillator (TCXO) typically incorporates extra devices that have temperature dependence to negate the temperature dependence of the crystal. The overall outcome is an oscillation frequency with low temperature dependence.

However, the ever increasing complexity of electronic systems due to requirements of supporting multiple standards, increased functionality, higher data rates and increased memory in a smaller size and at a lower cost is pushing designers to increase the integration level through the development of Systems on Chip (SoC) in deep submicron Complimentary MOS (CMOS) technologies to benefit from the increased gate density. Reference clocks incorporating crystal oscillators have not managed to scale or integrate due to the bulky nature of crystals, thus limiting the size and cost reduction possible for electronic systems.

Recent efforts in using high-Q MEMS resonators and Film Bulk Acoustic Resonators (FBARs) have illustrated possibilities of integrating a high-Q element and Application Specific Integrated Circuits (ASIC) in the same package. However, packaging induced stress and its impact on performance still remains as a challenging obstacle, since the high-Q element may require special packages and/or calibration that are not practical for SoCs. The stress may change the temperature behavior of the resonator, possibly resulting in large frequency shifts and accelerated aging. Therefore, special assembly and packaging techniques are typically required to mitigate such effects, which increase the cost of producing such clocks. Similar problems may be encountered by any resonator that is dependent on the mechanical properties of the resonator material, which require careful design and manufacturing procedures and processes.

Design requirements for applications such as USB and SATA, which do not require superior frequency accuracy and stability, can be satisfied using oscillators with relatively low-Q elements available in a CMOS process which can have adequate phase noise profiles generating good jitter performance. Current trials include the use of ring oscillators, relaxation oscillators and LC oscillators. However, the reported frequency accuracy of these implementations suffers from large drift across supply and temperature, making them ineffective for applications requiring precise accuracy and stability. A mitigation to reduce the drift across temperature requires trimming across temperature which is neither cost effective nor practical for SoCs.

Therefore, an integrated solution that relies on existing optimized process steps in CMOS technology and that satisfies frequency stability and jitter requirements would be of great value. LC tank oscillators operating at the tank temperature-null phase to achieve highly stable output frequency have been described in U.S. Pat. No. 8,072,281, incorporated herein by reference. Techniques and circuits described herein include improvements and extensions that take advantage of the temperature-null phase.

SUMMARY

The present disclosure describes a substantially temperature-independent LC-based oscillator. The oscillator includes an LC oscillator tank and frequency stabilizer circuitry coupled to the LC oscillator tank to cause the LC oscillator tank to operate at a temperature null phase generating a tank oscillation at a phase substantially equal to a temperature null phase. The temperature null phase is a phase of the LC oscillator tank at which variations in frequency of an output oscillation of the oscillator with temperature changes are reduced or minimized.

In U.S. Pat. No. 8,072,281 a first order model of the frequency variation versus temperature was analyzed and the theoretical expectation for the temperature-null characteristic was introduced. From a practical point of view, there are more factors that affect the temperature-null characteristic. These factors influence the temperature-null characteristic which in turn influences the overall frequency deviation versus temperature. This increased deviation increases the complexity of trimming and calibration during the manufacture of such LC-based oscillators.

The invention herein describes a method to control the temperature temperature-null characteristic by controlling the harmonic content of the current input to the LC oscillator tank which is in turn done by controlling the amplitude of the output signal across temperature. By applying the described method, a substantially temperature-independent output signal is achieved. In another aspect of this disclosure, several methods and apparatus to control the amplitude of the output signal are described.

DETAILED DESCRIPTION

Figure 1:
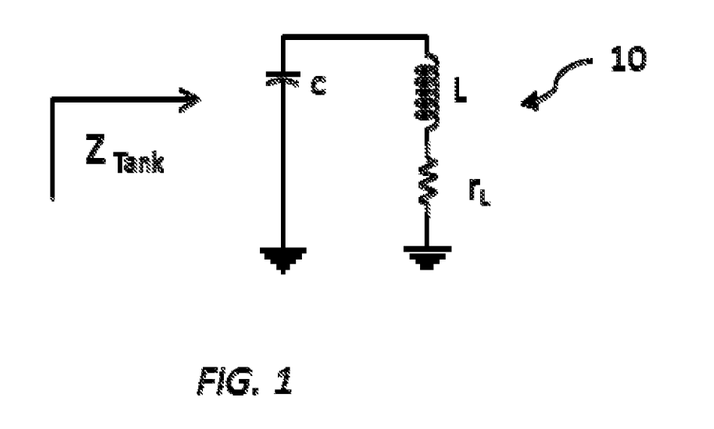
FIG. 1 is a circuit diagram illustrating an exemplary LC oscillator tank.

Referring now to FIG. 1, an LC oscillator tank circuit 10 used in building oscillators is composed of a source of inductance (inductive element) L and capacitance (capacitive element) C. The inductive element L and capacitive element C in the LC oscillator tank circuit 10 can be composed of various types of resonators and passive elements, such as but not limited to, on-chip integrated inductors, bond-wires, Metal-Insulator-Metal (MiM) Capacitors, Metal Finger Capacitors, Metal Oxide Semiconductor (MOS) capacitors, ceramic resonators, Micro Electro-Mechanical Systems (MEMS) tuning fork resonators, MEMS wine-glass resonators, MEMS-based resonators, Surface Acoustic Wave (SAW) and Bulk Acoustic Wave (BAW) devices.

The implementation of an ideal pure inductor or capacitor is usually not possible due to the physical limitations of having a finite quality factor Q. Integrated inductors in CMOS technology to date have low Q factors when compared to MEMS resonators and crystals. Sources of losses in an inductor include the inductor metal ohmic losses $r_L$ and substrate resistive losses $r_{SUB}$. Both of these losses are usually temperature dependent, and therefore, the overall impedance and Q of the inductor is temperature dependent.

The integrated capacitive part of the tank also suffers from a finite temperature dependent Q as well as temperature dependence of the capacitance value. As a result, the physical implementation of an integrated LC-tank will dictate a strong temperature dependence of the impedance and Q factor of the tank, which results in a temperature dependent tank resonance frequency.

An oscillator built using an LC oscillator tank 10 typically includes an amplifier responsible for overcoming the tank losses. For the oscillator to have sustained oscillations, the Barkhausen criterion requires an open loop gain greater than 1 and phase equal to zero. Assuming that the amplifier contributes a zero phase, then for oscillation to occur, the LC oscillator tank impedance $Z_{Tank}$ must have a zero phase. The phase condition is used to derive the oscillation frequency $\omega_{osc}$ as follows:

$$Z_{Tank} = \frac{r_L + j\omega L}{1 + j\omega r_L C - \omega^2 LC} \qquad \text{Equation 1}$$

$$\varphi_{Tank} = \tan^{-1}\frac{\omega L}{r_L} - \tan^{-1}\frac{\omega r_L C}{1 - \omega^2 LC} \qquad \text{Equation 2}$$

An oscillation condition of $\phi_{Tank}=0$ results in:

$$\omega_{osc} = \omega_o\sqrt{1 - \frac{r_L^2 C}{L}}, \qquad \text{Equation 3}$$

where $$\omega_o = \frac{1}{\sqrt{LC}}$$

From the above equations 1-3, it can be seen that the oscillation frequency is temperature dependent if $r_L$ is temperature dependent. A linear variation of $r_L$ with temperature results in an almost linear variation of the oscillation frequency. In addition, any temperature variation in C would strongly contribute to the temperature dependence.

Figure 2:
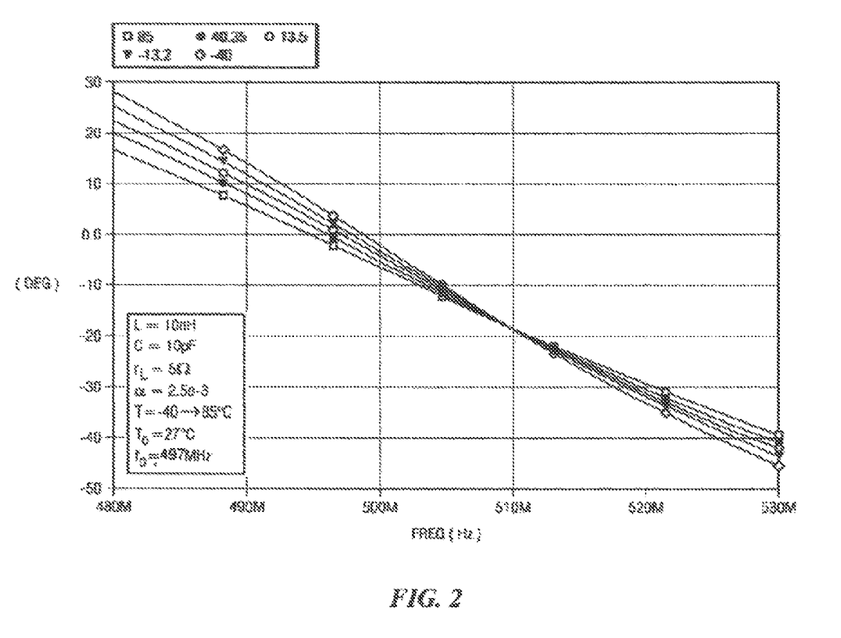
FIG. 2 illustrates phase plots of an exemplary LC oscillator tank.

This is graphically shown in FIG. 2, where $\phi_{Tank}$ is plotted for different temperatures for a tank composed of L, $r_L$ and C with linear temperature dependence of $r_L$ defined as:

$$r_L = r_o(1+\alpha(T-T_0)) \qquad \text{Equation 4}$$

where $\alpha$ is a temperature coefficient of $r_L$.

Figure 3:
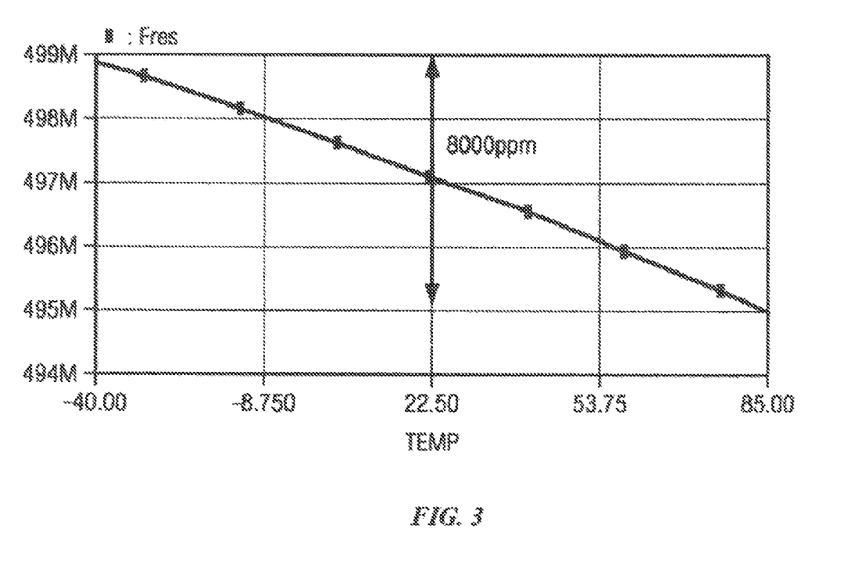
FIG. 3 illustrates the oscillation frequency across temperature of an LC oscillator tank operating at zero phase.

It is to be noted that the oscillation frequency is determined using the intersection of $\phi_{Tank}=0$ with the phase plots. The corresponding oscillation frequency across temperature is plotted in FIG. 3, showing a strong temperature dependence of 8000 ppm in a typical LC oscillator tank operating at zero phase.

Examining the phase plots again in FIG. 2, since the quality factor of the tank changes with temperature, the phase plots change with temperature. In addition, at the oscillation frequency, there is a higher Q at lower temperatures, and therefore, a larger negative slope is seen at lower temperatures. Therefore, the varying phase plot slopes with temperature result in the intersection of these plots.

When the intersections occur at the same phase, a temperature insensitive tank operating point is created, and the tank is said to be operating at a temperature "null" (TNULL) with a phase $\phi_{Null}$. The ideal temperature null phase occurs when the phase plots across temperature intersect at precisely the same phase. Oscillation with a phase across the tank ideally equal to $\phi_{Null}$ results in an oscillation frequency with zero deviation across temperature.

Figure 4:
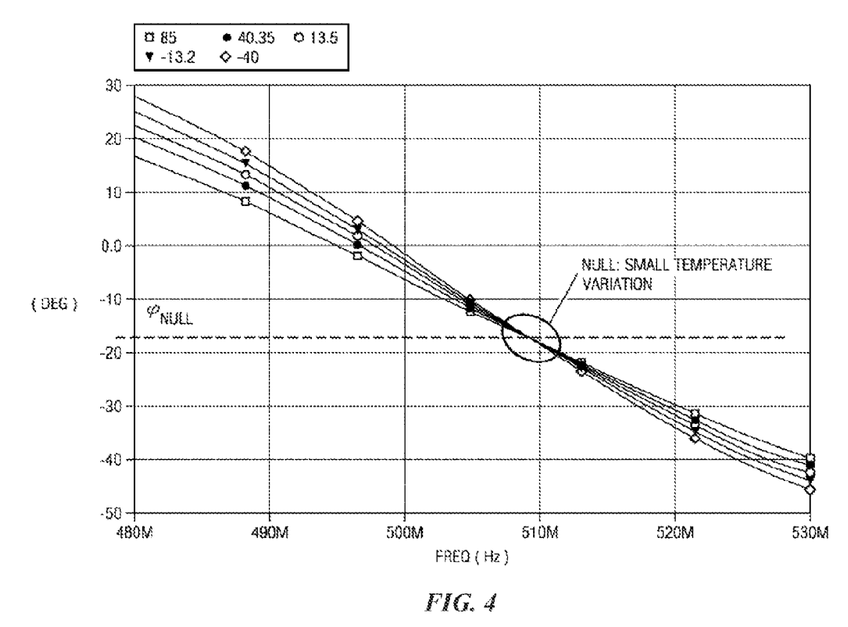
FIG. 4 illustrates a temperature null phase of an exemplary LC oscillator tank.
Figure 5:
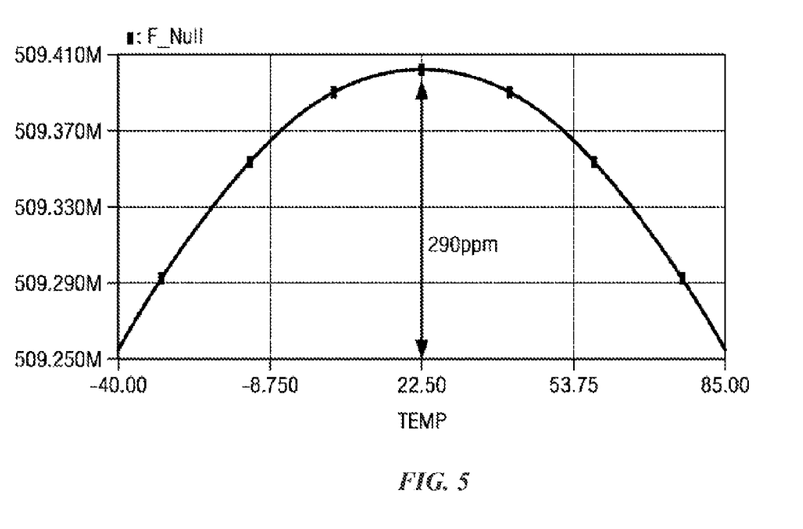
FIG. 5 illustrates the theoretical TNULL characteristic which is the frequency deviation across temperature as expected from the first order model while operating at the temperature null phase.

More realistic tanks exhibit a temperature null with small frequency deviations across temperature. This is illustrated graphically in FIG. 4, where the condition of oscillation is $\phi_{Tank}=\phi_{Null}$ and the corresponding oscillation frequency across temperature is plotted. As can be seen in FIG. 5, operating the oscillator at the temperature null phase results in an oscillation frequency with a much lower temperature dependence. For example, in FIG. 5, the frequency drift is only 290 ppm. Comparing this to the 8000 ppm frequency drift at zero phase in FIG. 3, oscillating at the temperature null phase produces a more stable frequency.

A Global Temperature Null (GNull) can be defined as a phase operating point $\phi_{GNull}$ that results in a minimum frequency deviation f across a temperature range T with a very small or zero change in oscillation frequency over temperature $$\frac{d f_{osc}}{dT}$$

at the center of the temperature range $T_0$. A measure of the quality of the temperature null is the oscillation frequency deviation across temperature. A Figure of Merit (FOM) of the tank temperature null may be defined as:

$$FOM = \frac{\Delta f}{f_{T_0 \Delta T}} ppm/°C. \qquad \text{Equation 5}$$

where $f_{T0}$ is the oscillation frequency at $T_0$. The smaller the value of the FOM, the better the null quality is with the perfect null occurring at FOM=0.

A Local Temperature Null (LNull) can be defined as a phase operating point $\phi_{LNull}$ with $$\frac{d f_{osc}}{dT} = 0.$$

Alternatively, LNull can be defined at temperature T as the intersection of the phase plots of temperatures (T+δ) and (T−δ) where δ is infinitesimally small.

The GNull oscillation frequency $\omega_{GNull}$ around temperature $T_0$ may be derived by finding the intersection of two phase curves at temperatures $T_0+\Delta T$ and $T_0-\Delta T$. For an LC oscillator tank with a linear temperature dependence of $r_L$ the phase and frequency at the GNull are as follows:

$$\omega_{GNull} = \omega_0 \sqrt{1 + \frac{C}{L} r_0^2 (1 - \alpha^2 \Delta T^2)} \qquad \text{Equation 6}$$

and therefore:

$$\phi_{GNull} = -\tan^{-1}(2 r_0 C \omega_{GNull}) \qquad \text{Equation 7}$$

Now referring back to FIG. 5, this curve shows the frequency variation versus temperature while operating at TNULL by assuming a first order model of the tank. The first order model of the tank versus temperature includes the temperature variations of the inductor DC (direct current) losses only. Practically speaking, there are more factors that affect the frequency variation versus temperature at TNULL in addition to the temperature varying inductor DC losses, such as and not limited to the temperature varying harmonics induced by the active circuitry, the temperature varying parasitic capacitances imposed by the routing interconnects and the active circuitry, the temperature varying non-ideal effects in the inductor of the tank such as the skin depth effect and the proximity effect and the temperature variation of the capacitance of the tank.

Due to such factors, the practical profile of frequency versus temperature at TNULL deviates from the theoretical expectations of the first order model. The final frequency profile varies according to the weight of each factor and the combination of the different factors.

Figure 6:
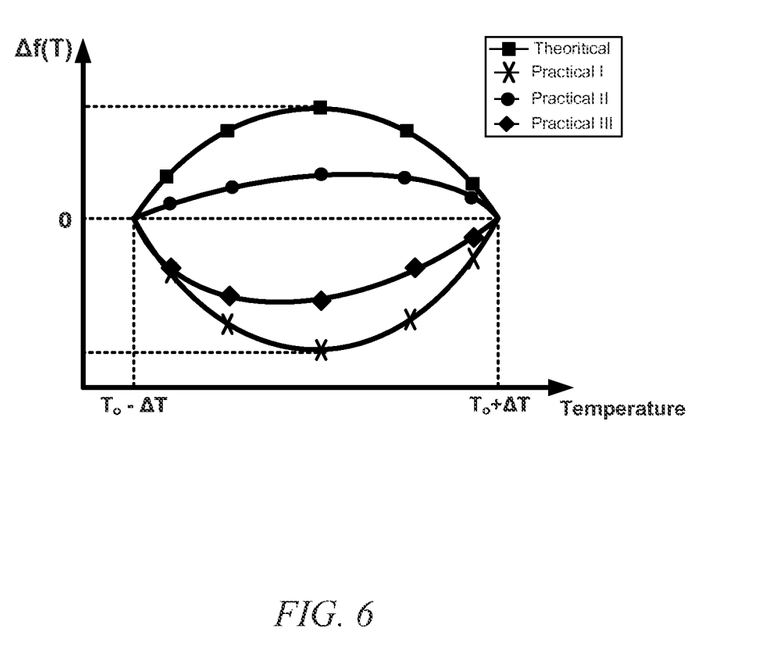
FIG. 6 illustrates three possible practical TNULL characteristics versus the theoretical expectation from the first order model.

The profile of the frequency variation versus temperature at the temperature null phase is denoted by the "Temperature Null Characteristic" or the "TNULL Characteristic". FIG. 6 compares three examples for possible practical TNULL characteristics to the expected theoretical TNULL characteristic from the first order model. The TNULL characteristic is the shape of the frequency deviation Δf(T) versus temperature, where Δf(T) is the frequency deviation referred to the oscillation frequency at the extremes of the temperature range $T_o-\Delta T$ and $T_o+\Delta T$ when operating at TNULL. Note that the frequency at the temperature range minimum $T_o-\Delta T$ is equal to the frequency at the temperature range maximum $T_o+\Delta T$ when operating at TNULL. Hence, Δf(T) is given as:

$$\Delta f(T) = \frac{f(T) - f(T_0 - \Delta T)}{f(T_0 - \Delta T)} \qquad \text{Equation 8}$$
$$= \frac{f(T) - f(T_0 + \Delta T)}{f(T_0 + \Delta T)}$$

In order to control the TNULL characteristic, the profile of the oscillation amplitude versus temperature is utilized so as to compensate for the frequency variations through the current harmonic content according to Equation 13 in U.S. Pat. No. 8,072,281. For convenience, Equation 13 is stated again here:

$$\omega = \omega_{os}\left(1 - \frac{1}{2Q^2} \sum_2^{\infty} \frac{n^2}{n^2-1} \frac{I_n^2}{I_1^2}\right) \qquad \text{Equation 9}$$

where $\omega_{os}$ is the oscillation frequency, and $I_n$ is the $n^{th}$ harmonic of the current in the tank.

In one aspect of this disclosure, the oscillation amplitude is deliberately changed across temperature with a specific profile. Thus, the harmonic content changes across temperature in a rather controlled manner which in turn induces variations in the oscillation frequency according to Equation 9. This amplitude profile with temperature is manipulated such that the induced frequency variations combined with the original frequency variations produce the required TNULL characteristic. Hence, the technique provides substantial control over the TNULL characteristic.

Figure 7:
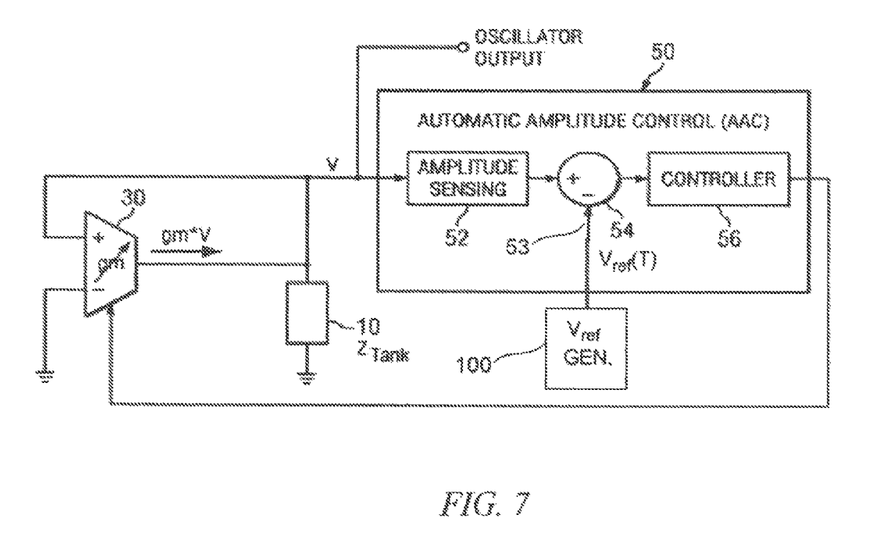
FIG. 7 Oscillator whose amplitude is controlled by an AAC whose reference voltage is a controlled function of temperature $V_{ref}(T)$.

In reference to FIG. 7, an oscillator having a tank circuit 10 and a transconductance amplifier 30 is shown with an Automatic Amplitude Control (AAC) block 50, including an amplitude sensing circuit 52, a difference circuit 54 to which a reference signal 53 $V_{ref}(T)$ is applied, and a controller 56. The oscillation amplitude is controlled by the AAC loop and it is a scaled value of the AAC reference voltage $V_{ref}(T)$. Thus, in one aspect of this disclosure, the required profile of the oscillation amplitude versus temperature is imposed through the AAC reference voltage $V_{ref}(T)$. The AAC reference voltage becomes a controlled programmable function of temperature. $V_{ref}(T)$ is programmed to achieve the required TNULL characteristic. Unlike the prior art (e.g., U.S. Pat. No. 8,072,281) in which the AAC reference voltage was assumed to be substantially constant with temperature, in the present methodology the AAC reference voltage is caused to vary as a function of temperature.

Figure 8:
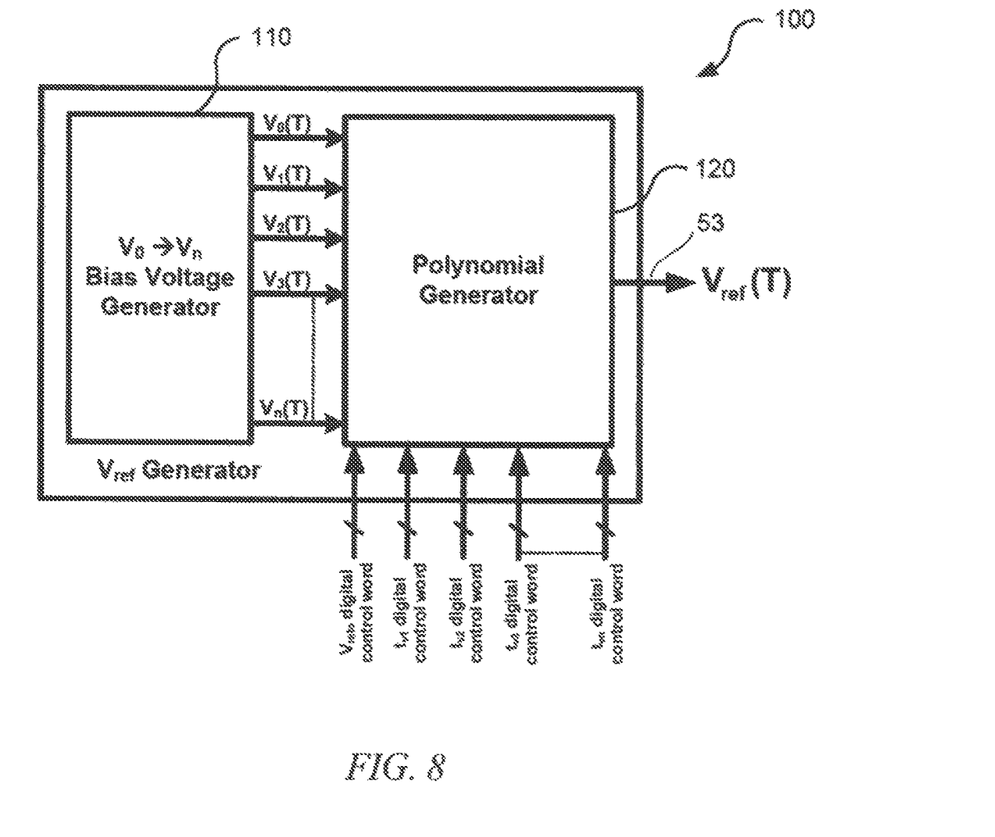
FIG. 8 illustrates a block diagram of $V_{ref}(T)$ generator circuit.

In another aspect of this disclosure, the reference voltage is programmed through a reference voltage generation circuit. An example of such a circuit is shown as 100 in FIG. 8. It primarily consists of a bias voltage generator block 110 and a polynomial generator block 120. The bias voltage generator block generates an array of temperature dependent bias voltages $V_0(T)$ to $V_n(T)$ where: T is the absolute temperature in Kelvin, n is an arbitrary integer and $V_x(T)$ is a polynomial function of temperature of the order x such that x is an integer that satisfies the inequality $0 \leq x \leq n$. Hence, $V_0(T)$ to $V_n(T)$ are given as:

$$V_0 \approx V_{00} \qquad \text{Equation 10A}$$

$$V_1(T) = V_{01}(1 + t_{V11}(T - T_0)) \qquad \text{Equation 10B}$$

$$V_2(T) = V_{02}(1 + t_{V12}(T - T_0) + t_{V22}(T - T_0)^2) \qquad \text{Equation 10C}$$

$$V_3(T) = V_{03}(1 + t_{V13}(T - T_0) + t_{V23}(T - T_0)^2 + t_{V33}(T - T_0)^3) \qquad \text{Equation 10D}$$

$$V_x(T) = V_{0x}(1 + t_{V1x}(T - T_0) + t_{V2x}(T - T_0)^2 \ldots + t_{Vxx}(T - T_0)^x) \qquad \text{Equation 10E}$$

$$V_n(T) = V_{0n}(1 + t_{V1n}(T - T_0) + t_{V2n}(T - T_0)^2 \ldots + t_{Vnn}(T - T_0)^n) \qquad \text{Equation 10F}$$

Where $T_o$ is the room temperature expressed in Kelvin and $V_{0x}$ is the value of the bias voltage $V_x(T)$ at room temperature $T_o$. Furthermore, $t_{vyx}$ is the $y^{th}$ order temperature coefficient of the voltage $V_x(T)$ where y is an integer that satisfies the inequality $1 \leq y \leq n$. Note that $V_0(T)$ is a weak function of temperature and thus its temperature dependence is neglected in the equations.

The voltages $V_0(T)$ to $V_n(T)$ are fed into the polynomial generator block 120. The polynomial generator block 120 combines the different bias voltages with the proper weighting and signal conditioning for each of them so as to generate the final reference voltage 53 Vref(T) with the required temperature dependence. The polynomial generator block 120 generates Vref(T) as a programmable $n^{th}$ order polynomial function of temperature according to the following equation:

$$V_{ref}(T) = V_{ref0}(1 + t_{V1}(T - T_0) + t_{V2}(T - T_0)^2 \ldots + t_{Vn}(T - T_0)^n) \qquad \text{Equation 11}$$

Where $t_{vy}$ is the $y^{th}$ order temperature coefficient for $V_{ref}(T)$ and y is an integer that satisfies the inequality $1 \leq y \leq n$ and $V_{refo}$ is the value of $V_{ref}(T)$ at room temperature $T_o$.

Moreover, $V_{refo}$ and the coefficients $t_{v1}$ through $t_{vn}$ are programmed using digital words that are fed to the polynomial generator block 120 as shown in FIG. 8. The polynomial generator block 120 translates the digital control words to the required temperature coefficients and thus generates the required reference voltage 53 $V_{ref}(T)$ from the different input voltages $V_0(T)$ through $V_n(T)$. The coefficients $t_{v1}$ through $t_{vn}$ are programmed to obtain the required oscillation amplitude profile versus temperature, while $V_{refo}$ is programmed to obtain the required magnitude of the oscillation amplitude.

Figure 9:
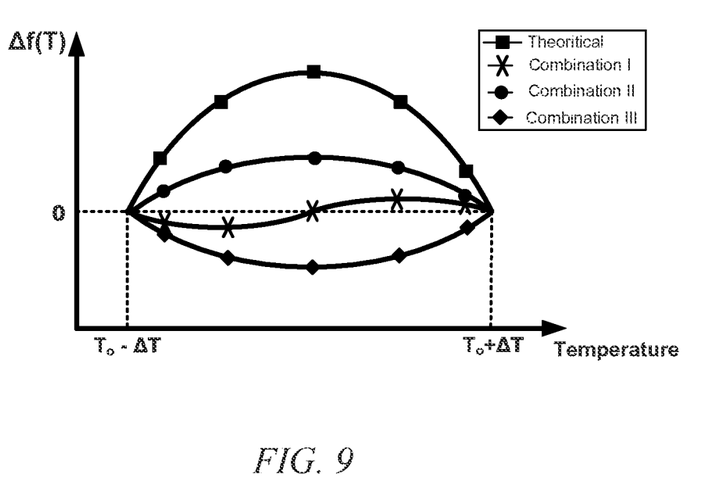
FIG. 9 illustrates three different TNULL characteristics at three different combinations of coefficients ($t_{v1}$ through $t_{vn}$) versus the theoretical expectations of the TNULL characteristics; the coefficients are programmed to control the TNULL characteristic.

The combination of the coefficients $t_{v1}$ through $t_{vn}$ determines the final TNULL characteristic. Every combination of coefficients generates a different TNULL characteristic according to the weight and strength of each coefficient. FIG. 9 shows the TNULL characteristics of 3 different combinations of coefficients. The coefficients are programmed to generate the required TNULL characteristic. Therefore, the technique provides substantial control over the TNULL characteristic.

Figure 10:
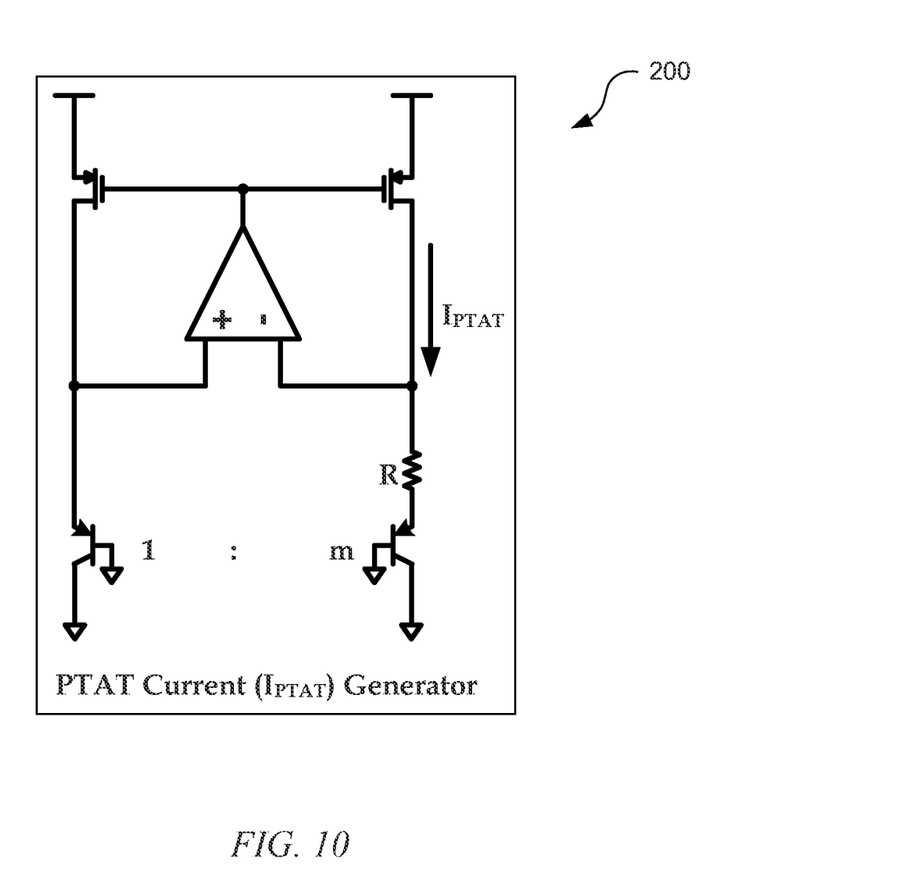
FIG. 10 illustrates a PTAT current ($I_{PTAT}$) generator circuit.

In another aspect of this disclosure, the different orders of temperature dependence can be generated by different circuits known in literature. As an example, a positive first order temperature dependent current can be generated by a thermal voltage ($V_T$) referenced bias circuit as the circuit shown in FIG. 10 by block 200. This circuit is well known in literature to produce a DC current that is Proportional To Absolute Temperature (PTAT) provided that the resistor R is weakly dependent upon temperature as described in "Analysis and Design of Analog Integrated Circuits," by Paul Gray, Paul J. Hurst, Stephen H. Lewis and Robert G. Meyer (John Wiley & Sons, Inc., fourth edition, 2001) and "Design of Analog CMOS Integrated Circuits," by Bahzad Razavi (McGraw-Hill, International edition, 2001). The resulting PTAT current ($I_{PTAT}$) is given by:

$$I_{PTAT}(T) = I_0(1 + \alpha(T - T_0)) \qquad \text{Equation 12}$$

where $I_o$ is the nominal current value at $T_o$ and $\alpha$ is the first order temperature coefficient of the current and it is approximately 3300 ppm/° K. for typical Silicon based processes.

Figure 11:
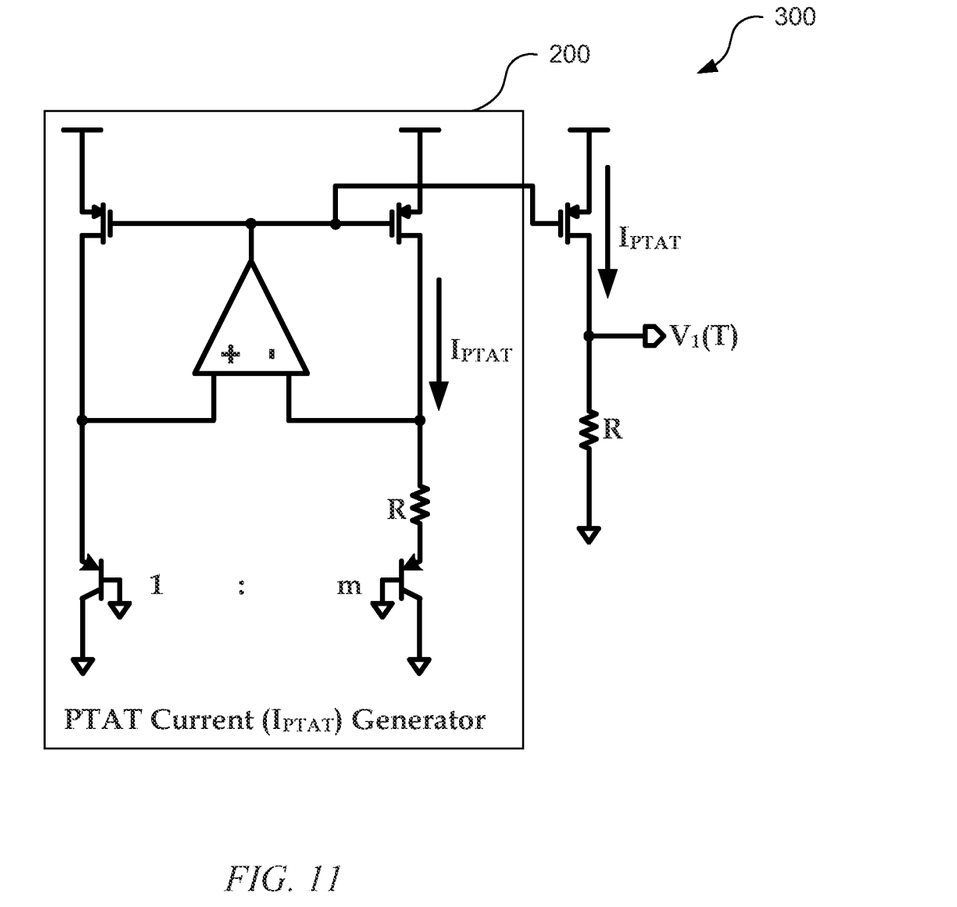
FIG. 11 illustrates the use of a PTAT current ($I_{PTAT}$) generator circuit to generate a first order temperature dependent voltage $V_1(T)$.

In another aspect of this disclosure, the circuit 300 in FIG. 11 may be used to obtain the control voltage $V_1(T)$. By allowing the PTAT current ($I_{PTAT}$) to flow in a resistor 310 that is weakly dependent upon temperature as shown in FIG. 11, one can obtain a voltage $V_1(T)$ that varies linearly with temperature according to the equation:

$$V_1(T) = I_0 R(1 + \alpha(T - T_0)) \qquad \text{Equation 13}$$

Hence, the circuit 300 of FIG. 11 can be used to obtain a positive first order temperature coefficient $t_{v11}$. For this specific example, $t_{v11}$ is 3300 ppm/° K. for typical Silicon based processes under the assumption that the temperature dependence of the resistor R 310 is negligible.

Figure 12:
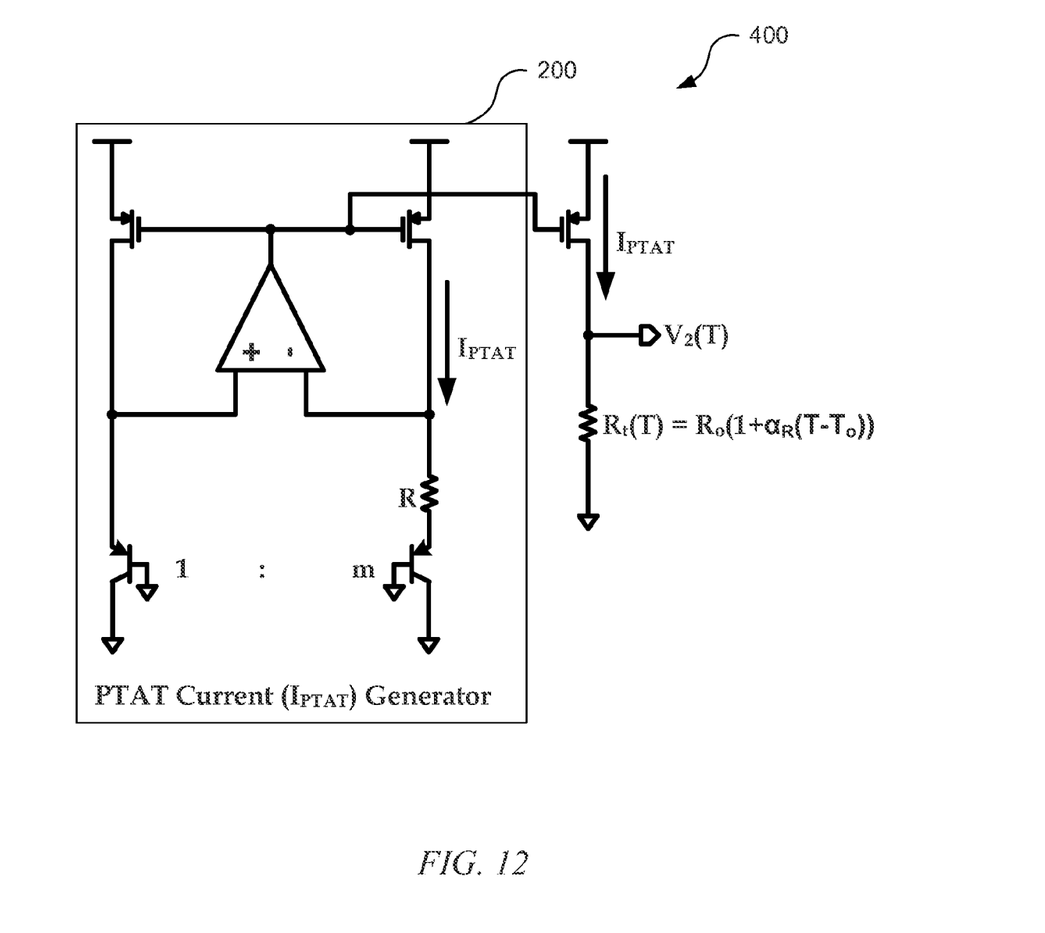
FIG. 12 illustrates how a PTAT current ($I_{PTAT}$) is used with a linear temperature dependent resistance $R_t(T)$ to generate a second order temperature dependent voltage $V_2(T)$.

In another aspect of this disclosure a second order temperature dependent voltage is produced by circuit 400 in FIG. 12. Here, the PTAT current is forced to flow in a resistance 410 that has substantially linear temperature dependence. The resistance 410 $R_t(T)$ is given by the relation:

$$R_t(T) = R_0(1 + \alpha_R(T - T_0)) \qquad \text{Equation 14}$$

where $R_o$ is the value of the resistance at temperature $T_o$ and $\alpha_R$ is the first order temperature coefficient of the resistance. The substantially linear temperature dependent resistance $R_t(T)$ can be realized by several methods. For example, in a typical silicon-based process, $R_t(T)$ can be realized by process modules such as and not limited to diffusion resistance, N-Well (N-doped substrate) resistance and active resistances realized by transistor devices.

Finally, the resulting voltage $V_2(T)$ is given as:

$$V_2(T) = I_{PTAT}(T) R_t(T) \qquad \text{Equation 15A}$$

$$V_2(T) = I_0 R_0 (1 + (\alpha + \alpha_R)(T - T_0) + \alpha \alpha_R (T - T_0)^2) \qquad \text{Equation 15B}$$

Therefore, for this specific example $V_2(T)$ is generated with $t_{v12} = \alpha + \alpha_R$ and $t_{v22} = \alpha \alpha_R$.

Figure 13:
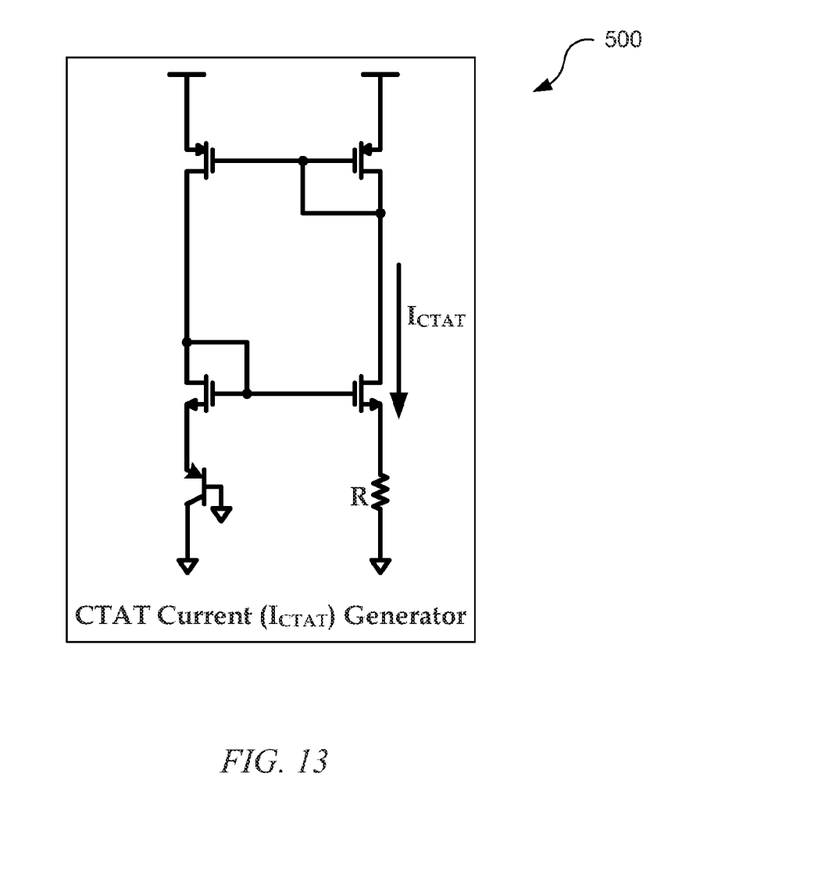
FIG. 13 is a diagram of a CTAT current ($I_{CTAT}$) generator circuit.

In order to obtain negative first and second order temperature coefficients, Complementary To Absolute Temperature (CTAT) circuits may be used. A CTAT circuit 500 is shown in FIG. 13. This circuit is well known in literature to produce a DC current that is Complementary To Absolute Temperature (CTAT) provided that the resistor R is weakly dependent upon temperature as described in "Analysis and Design of Analog Integrated Circuits," by Paul Gray, Paul J. Hurst, Stephen H. Lewis and Robert G. Meyer (John Wiley & Sons, Inc., fourth edition, 2001). The resulting CTAT current ($I_{CTAT}$) is given by:

$$I_{CTAT}(T) = I_0(1 - \alpha_C(T - T_0)) \qquad \text{Equation 16}$$

Where $I_o$ is the nominal current value at $T_o$ and $\alpha_C$ is the first order temperature coefficient of the current and it is approximately 3300 ppm/° K. for typical Silicon based processes.

Figure 14:
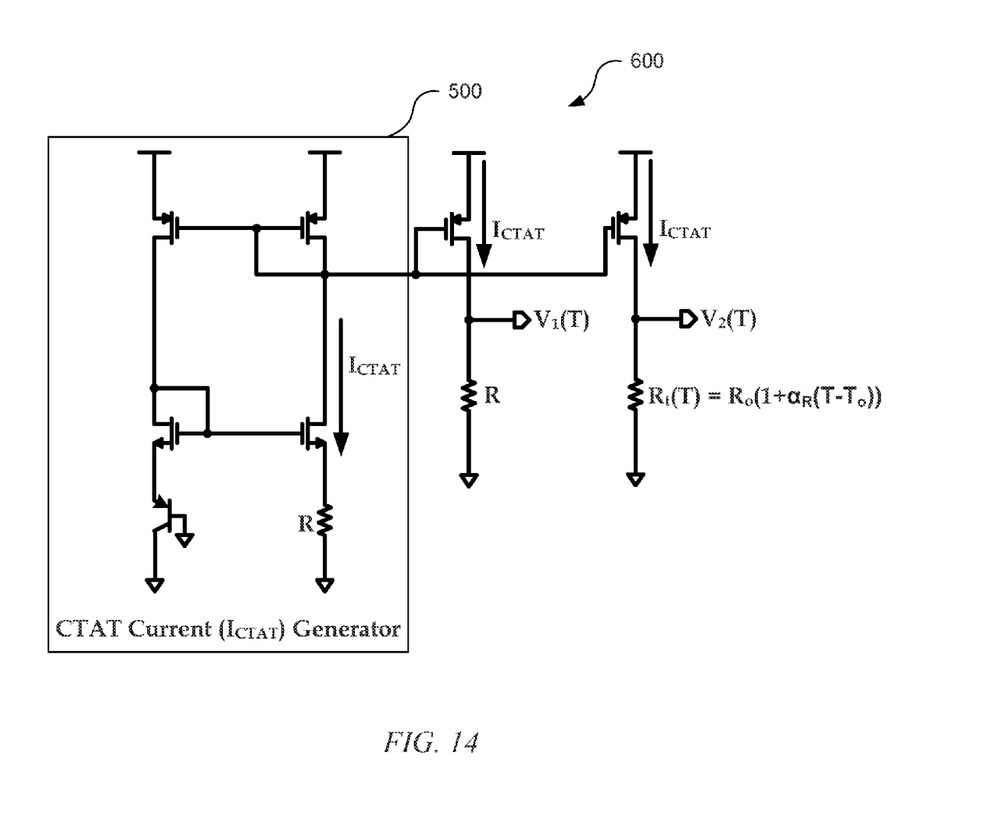
FIG. 14 illustrates the use of a CTAT current ($I_{CTAT}$) generator circuit to obtain $V_1(T)$ and $V_2(T)$ with negative first and second order coefficients.

In another aspect of this disclosure, FIG. 14 depicts the usage of the CTAT current generator to obtain negative first and second order temperature coefficients in $V_1(T)$ and $V_2(T)$. The circuit utilizes the same types of resistances utilized earlier with the PTAT generator. The output voltages are given by:

$$V_1(T)=I_0R(1-\alpha_C(T-T_0))  \quad \text{Equation 17}$$

$$V_2(T)=I_0R_0(1+(\alpha_R-\alpha_C)(T-T_0)-\alpha_C\alpha_R(T-T_0)^2) \quad \text{Equation 18}$$

Figure 15:
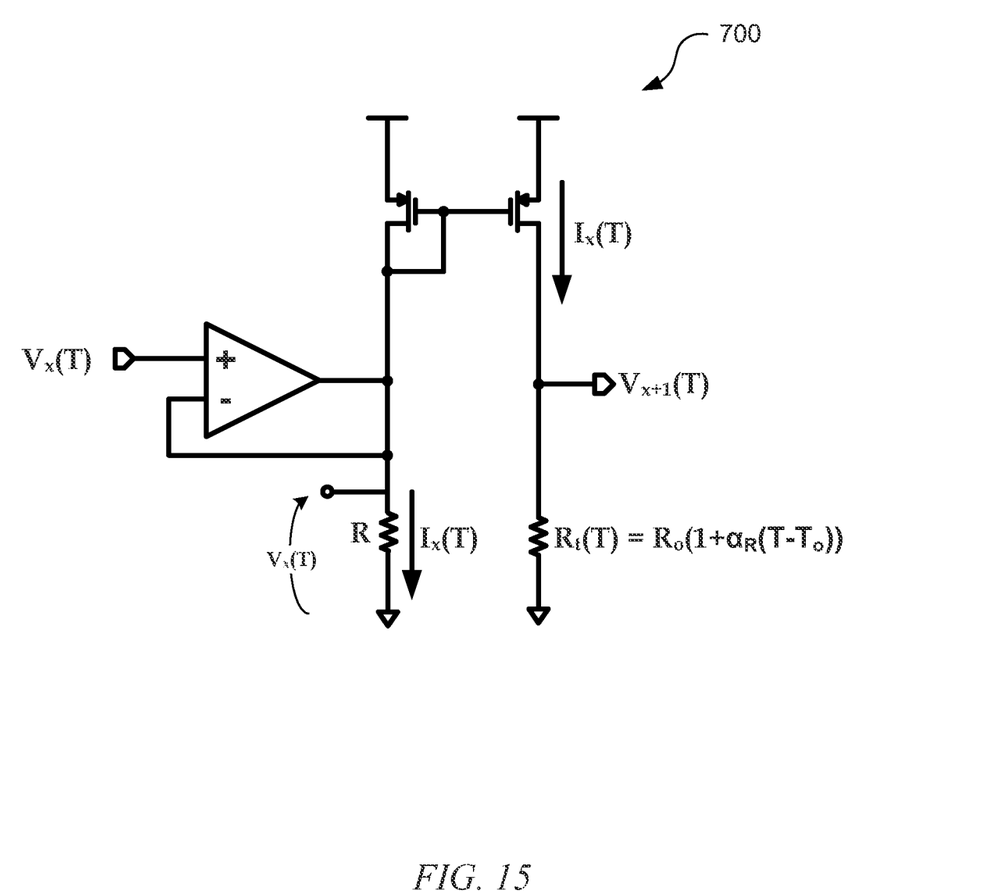
FIG. 15 illustrates a circuit that can generate $V_{x+1}(T)$ from $V_x(T)$.

In another aspect of this disclosure, coefficients with orders higher than the $2^{nd}$ order can be obtained by utilizing similar methods which depends upon having resistances that are highly temperature dependent. FIG. 15 depicts a circuit that can generate an $(x+1)^{th}$ order temperature dependent voltage $V_{x+1}(T)$ from an $x^{th}$ order temperature dependent voltage $V_x(T)$ by utilizing a resistance that has a substantially linear temperature dependence.

The circuit comprises an operational amplifier in a unity feedback configuration. It regenerates $V_x(T)$ on a resistor R that is weakly dependent on temperature and hence generates $I_x(T)$ which is a current of the same order of temperature dependence as $V_x(T)$ such that $$V_x(T) = V_{0x}(1 + t_{v1x}(T-T_0) + t_{v2x}(T-T_0)^2 \cdots + t_{vxx}(T-T_0)^x) \quad \text{Equation 19}$$

$$I_x(T) = \frac{V_{0x}}{R}(1 + t_{v1x}(T-T_0) + t_{v2x}(T-T_0)^2 \cdots + t_{vxx}(T-T_0)^x) \quad \text{Equation 20}$$

$I_x(T)$ is then mirrored and forced to flow in the resistor $R_r(T)$ which is substantially linear with temperature and finally generates $V_{x+1}(T)$:

$$V_{X+1}(T) = V_{0X}\frac{R_0}{R}(1 + (t_{V1X}+\alpha_R)(T-T_0) + (t_{V2X}+\alpha_r t_{V1X})(T-T_0)^2 + \cdots + t_{VXX}(T-T_0)^X + \alpha_R t_{VXX}(T-T_o)^{X+1} \quad \text{Equation 21}$$

As will be recognized by those skilled in the art, the innovative concepts described in the present application can be modified and varied over a wide range of applications. Accordingly, the scope of the invention should not be limited to any of the specific exemplary teachings discussed, but is instead defined by the following claims.

What is claimed is:

1. A method of controlling an LC oscillator circuit that produces an output signal having an amplitude and a frequency, the output signal having a frequency dependence on temperature and also having a frequency dependence on amplitude, the method comprising:
    operating the oscillator circuit within a region of a local or global temperature null, in which region the frequency of the output signal exhibits a reduced sensitivity to changes in temperature;
    sensing a change in temperature;
    generating a reference signal for automatic amplitude control that is caused to vary as a function of temperature; and
    controlling amplitude of the output signal in response to the reference signal such that the frequency of the output signal follows a desired trajectory as a function of temperature in the region of the temperature null.

2. The method of claim 1, wherein the function of temperature is programmable.

3. The method of claim 1, comprising generating the reference signal using a polynomial generator.

4. The method of claim 1, comprising generating the reference signal using at least one of the following: a PTAT current generator and a CTAT current generator.

5. The method of claim 1, wherein the function of temperature is chosen such that a change in frequency of the output signal as a result of the change in temperature is reduced or minimized.

6. An LC oscillator circuit that produces an output signal having an amplitude and a frequency, the output signal having a frequency dependence on temperature and also having a frequency dependence on amplitude, comprising:
    circuitry for operating the oscillator circuit within a region of a local or global temperature null, in which region the frequency of the output signal exhibits a reduced sensitivity to changes in temperature;
    circuitry for sensing a change in temperature and for generating a reference signal for automatic amplitude control as a function of temperature; and
    an automatic amplitude controller for controlling amplitude of the output signal in response to the reference signal such that the frequency of the output signal follows a desired trajectory as a function of temperature in the region of the temperature null.

7. The apparatus of claim 6, wherein the function of temperature is programmable.

8. The apparatus of claim 6, wherein the circuitry comprises a polynomial generator.

9. The apparatus of claim 6, wherein the circuitry comprises at least one of the following: a PTAT current generator and a CTAT current generator.

10. The apparatus of claim 6, wherein the function of temperature is chosen such that a change in frequency of the output signal as a result of the change in temperature is reduced or minimized.

11. A method of controlling an oscillator circuit that produces an output signal having an amplitude and a frequency, the output signal having a frequency dependence on an environmental variable and also having a frequency dependence on amplitude, the method comprising:
    sensing a change in the environmental variable; and
    controlling amplitude of the output signal such that the frequency of the output signal follows a desired trajectory as a function of the environmental variable.

12. The method of claim 11, wherein the environmental variable is temperature.

13. The method of claim 12, wherein the oscillator circuit is an LC oscillator circuit, comprising operating the oscillator circuit within a region of a local or global temperature null, in which region the frequency of the output signal exhibits a reduced sensitivity to changes in temperature.

14. The method of claim 13, wherein controlling comprising generating a reference signal for automatic amplitude control as a function of temperature.

15. The method of claim 14, comprising generating the reference signal using a polynomial generator.

16. The method of claim 14, comprising generating the reference signal using at least one of the following: a PTAT current generator and a CTAT current generator.

17. The method of claim 14, wherein the reference signal causes the frequency of the output signal to follow a desired trajectory as a function of temperature in the region of the temperature null.

18. The method of claim 14, wherein the function of temperature is chosen such that a change in frequency of the output signal as a result of the change in temperature is reduced or minimized.

19. An oscillator circuit that produces an output signal having an amplitude and a frequency, the output signal having a frequency dependence on an environmental variable and also having a frequency dependence on amplitude, comprising:
sensing circuitry for sensing a change in the environmental variable; and
a controller coupled to the sensing circuitry for controlling amplitude of the output signal such that the frequency of the output signal follows a desired trajectory as a function of the environmental variable.

20. The apparatus of claim 19, wherein the environmental variable is temperature.

21. The apparatus of claim 20, wherein the oscillator circuit is an LC oscillator circuit, comprising circuitry for setting an operating condition of the oscillator circuit to be within a region of a local or global temperature null, in which region the frequency of the output signal exhibits a reduced sensitivity to changes in temperature.

22. The apparatus of claim 21, wherein the oscillator circuit comprises an amplifier, and wherein the controller comprises an automatic amplitude controller.

23. The apparatus of claim 21, wherein the controller is configured to generate a reference signal for automatic amplitude control as a function of temperature.

24. The apparatus of claim 23, comprising a polynomial generator for generating the reference signal.

25. The apparatus of claim 23, wherein the sensing circuitry comprises at least one of the following: a PTAT current generator and a CTAT current generator.

26. The apparatus of claim 23, wherein the controller is configured such that the control signal causes the frequency of the output signal to follow a desired trajectory as a function of temperature in the region of the temperature null.

27. The apparatus of claim 23, wherein the function of temperature is chosen such that a change in frequency of the output signal as a result of the change in temperature is reduced or minimized.

* * * * *